United States Patent
Kim et al.

(10) Patent No.: US 8,970,532 B2
(45) Date of Patent: Mar. 3, 2015

(54) TOUCH SENSOR INTEGRATED TYPE DISPLAY DEVICE AND METHOD OF MANUFACTURING THE SAME

(71) Applicant: LG Display Co., Ltd., Seoul (KR)

(72) Inventors: Cheolse Kim, Daegu (KR); Manhyeop Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 71 days.

(21) Appl. No.: 13/853,676

(22) Filed: Mar. 29, 2013

(65) Prior Publication Data

US 2013/0257774 A1 Oct. 3, 2013

(30) Foreign Application Priority Data

Mar. 30, 2012 (KR) .................. 10-2012-0033235

(51) Int. Cl.
*G06F 3/041* (2006.01)
*G06F 3/044* (2006.01)
*H01L 27/12* (2006.01)
*G02F 1/1333* (2006.01)

(52) U.S. Cl.
CPC .............. *G06F 3/0412* (2013.01); *G06F 3/044* (2013.01); *H01L 27/1259* (2013.01); *G02F 1/13338* (2013.01); *G06F 2203/04103* (2013.01)
USPC ......................................... 345/173; 345/178

(58) Field of Classification Search
CPC .... G06F 3/0412; G06F 3/044; H01L 27/1259
USPC ........... 345/104, 156, 173–179, 204; 438/22, 438/34, 48; 178/18.05; 349/155
See application file for complete search history.

(56) References Cited

U.S. PATENT DOCUMENTS

| 7,762,470 | B2* | 7/2010 | Finn et al. ..................... 235/492 |
| 8,040,326 | B2* | 10/2011 | Hotelling et al. ............. 345/173 |
| 8,243,027 | B2* | 8/2012 | Hotelling et al. ............. 345/173 |
| 2006/0012575 | A1 | 1/2006 | Knapp et al. |

(Continued)

FOREIGN PATENT DOCUMENTS

| DE | 20 2011 052 512 U1 | 2/2012 |
| DE | 20 2011 052 465 U1 | 3/2012 |

(Continued)

OTHER PUBLICATIONS

European Patent Office, Search Report and Opinion, European Patent Application No. 13161385.3, Sep. 4, 2014, sixteen pages.

*Primary Examiner* — Prabodh M Dharia
(74) *Attorney, Agent, or Firm* — Fenwick & West LLP

(57) ABSTRACT

A touch sensor integrated type display device capable of reducing its thickness and simplifying its manufacturing process. The display device includes first electrodes, second electrodes, first connecting wires, and second connecting wires. The first electrodes are arranged on a substrate in parallel in a first direction, and the second electrodes are arranged in parallel in the first direction and a second direction crossing the first direction without contacting the first electrodes. Each first connecting wire is connected with at least one the first electrodes. Each second connecting wire connects the second electrodes to each other in the second direction. A touch driving voltage is supplied to the first connecting wires and a common voltage is supplied to the second connecting wires so that mutual capacitance is generated between the first electrodes and the second electrodes.

14 Claims, 12 Drawing Sheets

(56) References Cited

U.S. PATENT DOCUMENTS

| | | |
|---|---|---|
| 2008/0048995 A1 | 2/2008 | Abileah et al. |
| 2008/0252608 A1* | 10/2008 | Geaghan ................. 345/173 |
| 2010/0045632 A1 | 2/2010 | Yilmaz et al. |
| 2010/0182273 A1 | 7/2010 | Noguchi et al. |
| 2010/0328257 A1* | 12/2010 | Noguchi et al. ........... 345/174 |
| 2011/0061947 A1* | 3/2011 | Krah et al. ............. 178/18.01 |
| 2011/0242027 A1* | 10/2011 | Chang .................... 345/173 |
| 2011/0298746 A1 | 12/2011 | Hotelling |
| 2012/0044171 A1 | 2/2012 | Lee et al. |
| 2012/0069257 A1 | 3/2012 | Oh et al. |
| 2012/0154327 A1* | 6/2012 | Liu ......................... 345/174 |
| 2012/0206403 A1* | 8/2012 | Wang et al. ............... 345/174 |
| 2012/0274603 A1 | 11/2012 | Kim et al. |
| 2012/0306811 A1* | 12/2012 | Farmer et al. ............ 345/174 |
| 2013/0038563 A1 | 2/2013 | Yilmaz et al. |
| 2013/0086503 A1 | 4/2013 | Kotowski |
| 2013/0257786 A1* | 10/2013 | Brown et al. ............. 345/174 |
| 2014/0071360 A1* | 3/2014 | Chang et al. .............. 349/12 |

FOREIGN PATENT DOCUMENTS

| | | |
|---|---|---|
| EP | 2 420 919 A2 | 2/2012 |
| EP | 2 431 847 A1 | 3/2012 |
| WO | WO 2004/053576 A1 | 6/2004 |

* cited by examiner

TOUCH SENSOR INTEGRATED TYPE DISPLAY DEVICE AND METHOD OF MANUFACTURING THE SAME

CROSS-REFERENCE TO RELATED APPLICATION

This application claims priority under 35 U.S.C. §119(a) to Korean Patent Application No. 10-2012-0033235 filed on Mar. 30, 2012, which is incorporated by reference herein in its entirety.

BACKGROUND OF THE INVENTION

1. Field of the Invention

This disclosure relates to a touch sensor integrated type display device capable of perceiving touch of the display device, and a method of manufacturing the same.

2. Discussion of the Related Art

In recent years, various input devices such as a keyboard, a mouse, a joystick and a digitizer are used for constructing interfaces between users and home appliances or information telecommunication devices. However, when a user makes use of these input devices, user's dissatisfaction increases because the user is required to know how to use the input devices and the input devices occupy space. Therefore, a convenient and simple input device that can reduce erroneous operation is required. According to the requirement, there is proposed a touch sensor that can input information by directly contacting a screen with a user's finger or a pen.

The touch sensor has a simple configuration capable of reducing erroneous operations. The user can also perform an input action without using a separate input device, and can quickly and easily manipulate a device through contents displayed on a screen. Accordingly, the touch sensor has been applied to various display devices.

The touch sensor used in the display devices may be classified into an add-on type touch sensor, and an on-cell type touch sensor. The add-on type touch sensor is configured such that the display device and the add-on type touch sensor are individually manufactured and then the add-on type touch sensor is attached to an upper substrate of the display device. The on-cell type touch sensor is configured such that components constituting the on-cell type touch sensor are directly formed on the surface of an upper glass substrate of the display device.

There is a problem that a thickness of the display device increases because the add-on type touch sensor has the structure in which the add-on type touch sensor is mounted on the display device. Further, the visibility of the display device is reduced because of a reduction in a brightness of the display device due to the increased thickness.

On the other hand, the on-cell type touch sensor shares the glass substrate with the display device because the on-cell type touch sensor has the structure in which the on-cell type touch sensor is formed on the surface of the glass substrate of the display device. Therefore, a thickness of the display device using the on-cell type touch sensor is less than a thickness of the display device using the add-on type touch sensor. However, the entire thickness of the display device using the on-cell type touch sensor increases because of a touch driving electrode layer, a touch sensing electrode layer, and an insulating layer for insulating the touch driving electrode layer and the touch sensing electrode layer which constitute the on-cell type touch sensor. Further, the number of processes and the manufacturing cost in the on-cell type touch sensor increase.

Accordingly, there is a need for a touch sensor integrated type display device capable of solving the problems of the above-described kinds of touch sensors.

SUMMARY OF THE INVENTION

Embodiments of the invention provide a touch sensor integrated type display device capable of reducing its thickness and simplifying its manufacturing process by sharing a touch sensing element for recognizing a touch operation with a component of a display device, and a method of manufacturing the same.

In one aspect, there is a touch sensor integrated type display device comprising a plurality of first electrodes arranged on a substrate in parallel in a first direction; a plurality of second electrodes arranged in parallel in the first direction and a second direction crossing the first direction without contacting with the plurality of first electrodes; a plurality of first connecting wires, each first connecting wire being connected with at least one of the plurality of the first electrodes; and a plurality of second connecting wires, each second connecting wire connecting the second electrodes to each other in the second direction, wherein a touch driving voltage is supplied to the plurality of first connecting wires and a common voltage is supplied to the plurality of second connecting wires so that mutual capacitance is generated between the a plurality of first electrodes and the plurality of second electrodes.

In another aspect, there is a touch sensor integrated type display device comprising gate lines and data lines, which are formed on a substrate to cross over each other; a plurality of pixel electrodes formed in areas defined by the crossing of the gate lines and the data lines; a plurality of first electrodes arranged in parallel with the gate lines; a plurality of second electrodes arranged in parallel in the gate lines and the data lines without contacting with the plurality of first electrodes; a plurality of first connecting wires, each first connecting wire being connected with at least one of the plurality of the first electrodes; and a plurality of second connecting wires, each second connecting wire connecting the second electrodes to each other in parallel with the data line, wherein a touch driving voltage is supplied to the plurality of first connecting wires during a touch mode and a common voltage is supplied to the plurality of second connecting wires during a display mode so that mutual capacitance is generated between the a plurality of first electrodes and the plurality of second electrodes.

Each of plurality of second connecting wires includes at least two sub-connecting wires.

The plurality of second electrodes serve as common electrodes and touch sensing electrodes.

The first plurality of electrodes, the first and second connecting wires are made of a metal material such as Cu, CuOx, Al, AlNd, Mo, MoTi, or Cr, and the second plurality of electrodes are made of a transparent conductive material such as indium tin oxide (ITO), indium zinc oxide (IZO), or gallium-doped zinc oxide (GZO).

Any one of the pixel electrode and the second electrode includes a plurality of openings, which elongate in an area overlapping the pixel electrode to be spaced apart from each other at a predetermined distance.

In another aspect, there is provided a method of manufacturing a touch sensor integrated type display device comprising forming a first conductive layer on a substrate, and forming a gate line and a gate electrode using first mask process; forming a gate insulation the substrate on which the gate line and the gate electrode are formed, forming a semiconductor layer on the gate insulation, and forming a semiconductor pattern on a region of the gate insulation layer corresponding to the gate electrode by patterning the semiconductor layer using a second mask process; forming a data metal layer as a second conductive layer on the gate insulation layer, and forming first conductive pattern group including a data line, a source electrode extended from the data lines and a drain electrode opposite to the source electrode by patterning the data metal layer using a third mask process; forming a first passivation layer on an entire surface of the gate insulation layer on which the first conductive pattern group is formed, and forming a first contact hole exposing a portion of the drain electrode by etching the first passivation layer using a fourth mask process; forming a first transparent conductive layer as a third conductive layer on the first passivation layer in which the first contact hole is formed, and forming a pixel electrode by patterning the first transparent conductive layer using a fifth mask process; sequentially forming a second passivation layer and a fourth conductive layer on the first passivation layer on which the pixel electrode is formed, forming a plurality of first electrodes by etching the fourth conductive layer using a sixth mask process, the plurality of first electrodes being arranged in parallel with the gate line; and forming a third passivation layer on the second passivation layer on which the plurality of first electrodes are formed, forming a second transparent conductive layer as a fifth conductive layer on the third passivation layer, and forming a plurality of second electrodes by etching the second transparent conductive layer using a seventh mask process, the plurality of second electrodes being arranged in parallel with the gate lines and the data lines.

The method further comprises forming a sixth conductive layer on the second passivation layer on which the plurality of the first electrodes are formed, and forming a plurality of first connecting wires which connect the plurality of the first electrodes to each other by etching the sixth conductive layer.

The method further comprises forming a seventh conductive layer on the third passivation layer on which the plurality of the second electrodes are formed, and forming a plurality of first connecting wires which connect the plurality of the second electrodes to each other in parallel with the data line by etching the seventh conductive layer.

The plurality of second electrodes serve as common electrodes and touch sensing electrodes.

The first plurality of electrodes and the first and second connecting wires are made of a metal material such as Cu, CuOx, Al, AlNd, Mo, MoTi, or Cr, and the second plurality of electrodes are made of transparent conductive material such as indium tin oxide (ITO), indium zinc oxide (IZO), or gallium-doped zinc oxide (GZO).

BRIEF DESCRIPTION OF THE DRAWINGS

The teachings of the embodiments can be readily understood by considering the following detailed description in conjunction with the accompanying drawings.

DETAILED DESCRIPTION OF THE EMBODIMENTS

Figure 1:
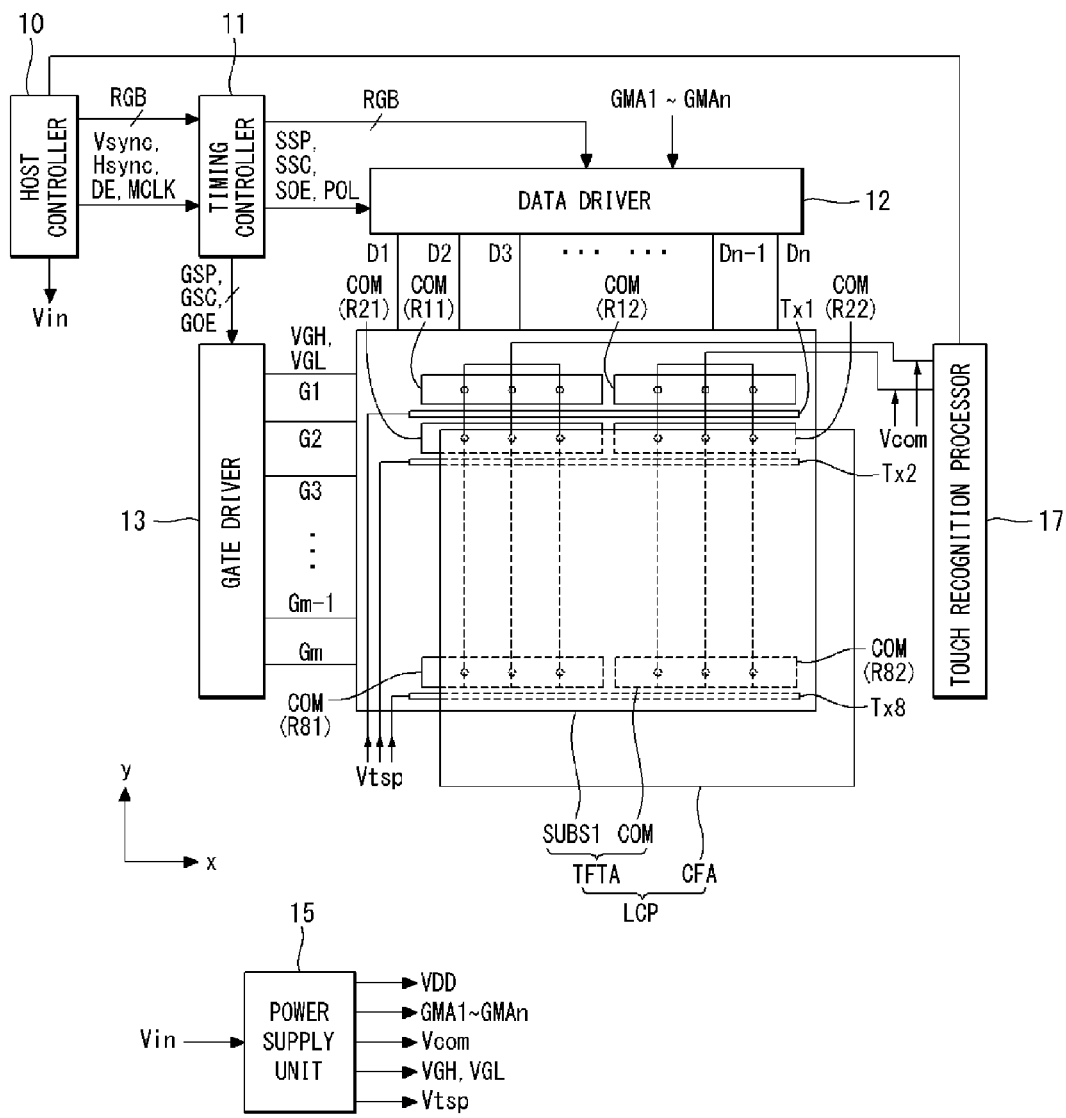
FIG. 1 is a block diagram schematically illustrating a touch sensor integrated type display device according to one embodiment of the invention.

Hereinafter, exemplary embodiments of this disclosure will be described in detail with reference to the accompanying drawings, wherein same reference numerals may be used to denote the same or substantially the same elements throughout the specification and the drawings.

A touch sensor integrated type display device according to an example embodiment of the invention is described in detail with reference to FIGS. 1 to 3B. FIG. 1 is a block diagram schematically illustrating a touch sensor integrated type display device according to one embodiment of the invention, FIG. 2 is a partial exploded perspective view schematically showing the display device shown in FIG. 1, FIG. 3A is a top plan view schematically illustrating a relationship between touch driving electrodes and touch sensing electrodes (which is served as common electrodes) of the touch sensor integrated type display device according to the embodiment of the invention, and FIG. 3B is a cross-sectional view taken along line I-I' of FIG. 3A.

In the following description, a touch sensor integrated type liquid crystal display device is used as an example of the touch sensor integrated type display device.

Figure 2:
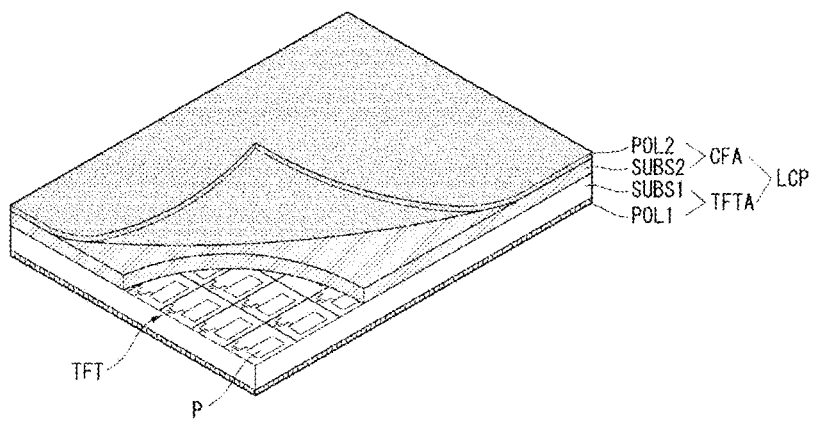
FIG. 2 is a partial exploded perspective view schematically showing the display device shown in FIG. 1.
Figure 3A:
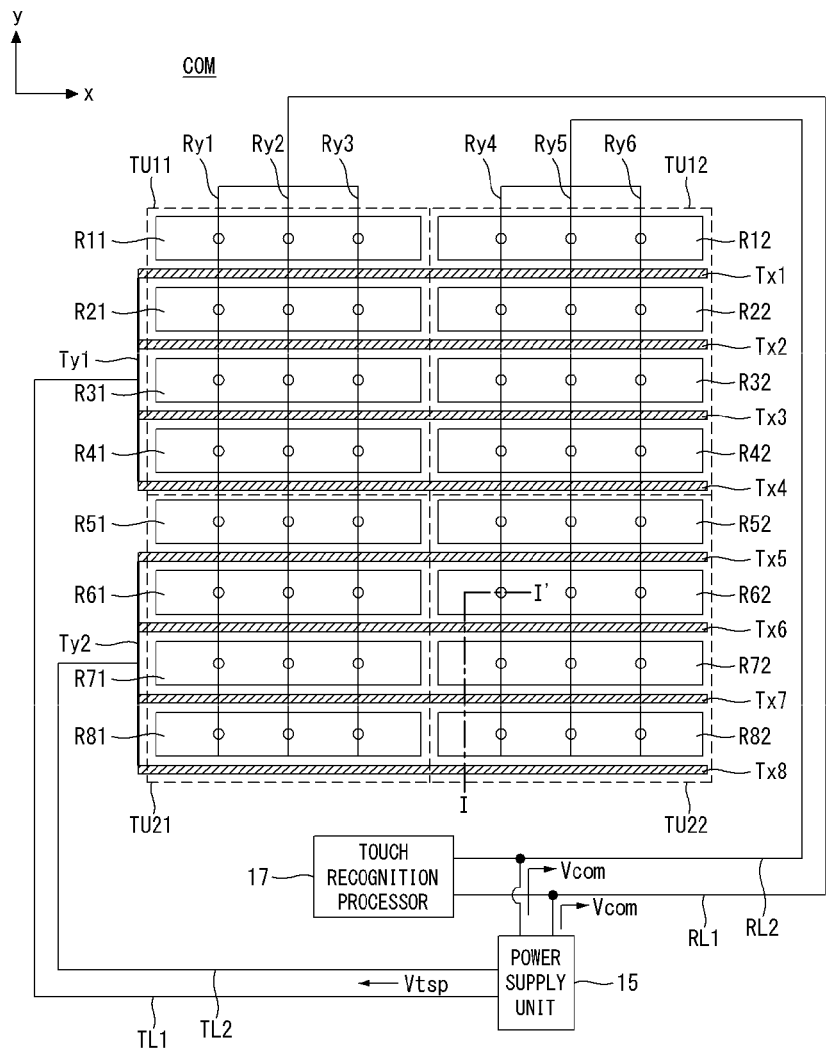
FIG. 3A is a top plan view schematically illustrating a relationship between touch driving electrodes and touch sensing electrodes (which is served as common electrodes) of the touch sensor integrated type display device according to the embodiment of the invention.
Figure 3B:
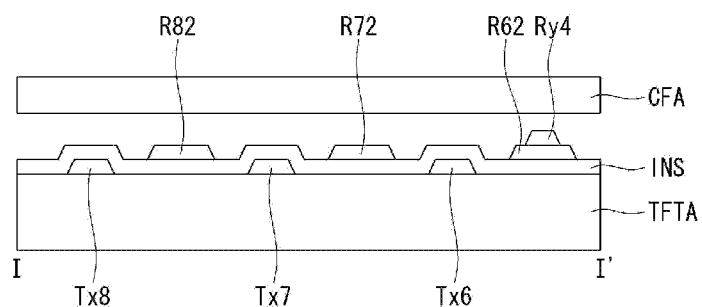
FIG. 3B is a cross-sectional view taken along line I-I' of FIG. 3A.

As shown in FIGS. 1 and 2, the touch sensor integrated type liquid crystal display according to one embodiment of the invention includes a liquid crystal display panel LCP, a host controller 10, a timing controller 11, a data driver 12, a gate driver 13, a power supply unit 15, and a touch recognition processor 17.

The liquid crystal display panel LCP includes a color filter array CFA and a thin film transistor (TFT) array TFTA with a liquid crystal layer interposed therebetween.

The TFT array TFTA includes a plurality of gate lines G1, G2, G3, ..., Gm-1, and Gm, which are formed parallel to one another on a first substrate SUBS1 in a first direction (for example, x-axis direction), a plurality of data lines D1, D2, D3, ..., Dn-1, and Dn, which are formed parallel to one another in a second direction (for example, a y-axis direction) to cross the plurality of gate lines G1, G2, G3, ..., Gm-1, and Gm, TFTs respectively formed at crossings of the gate lines G1, G2, G3, ..., Gm-1, and Gm and the data lines D1, D2, D3, ... Dn-1, and Dn, a plurality of pixel electrodes P for charging a data voltage in liquid crystal cells, and a common electrode COM positioned to be opposite to the plurality of pixel electrodes P.

The color filter array CFA includes black matrixes and color filters, which are formed on a second substrate SUBS2. Polarizing plates POL1 and POL2 are respectively attached to outer surfaces of the first substrate SUBS1 and the second substrate SUBS2 of the liquid crystal display panel LCP. Alignment layers for setting a pre-tilt angle of liquid crystals are respectively formed on inner surfaces of the first substrate SUBS1 and the second substrate SUBS2 contacting the liquid crystals. A column spacer may be formed between the first substrate SUBS1 and the second substrate SUBS2 to maintain cell gaps of the liquid crystal cells.

A backlight unit (not shown) is disposed under the TFT array TFTA. The backlight unit includes a plurality of light sources to uniformly irradiate light onto the TFT array TFTA and the color filter array CFA. The backlight unit may be implemented as one of an edge type backlight unit and a direct type backlight unit. The light sources of the backlight unit may include one or at least two of a hot cathode fluorescent lamp (HCFL), a cold cathode fluorescent lamp (CCFL), an external electrode fluorescent lamp (EEFL), and a light emitting diode (LED).

The common electrode COM is formed on the second substrate SUBS2 in a vertical electric field driving manner such as a twisted nematic (TN) mode and a vertical alignment (VA) mode. Further, the common electrode COM is formed on the first substrate SUBS1 along with the pixel electrodes P in a horizontal electric field driving manner such as an in-plane switching (IPS) mode and a fringe field switching (FFS) mode. The common electrode COM in the horizontal electric field driving manner is described as an example.

FIG. 3A is a top plan view schematically illustrating a relationship between touch driving electrodes and touch sensing electrodes (which serve as common electrodes) of the touch sensor integrated type display device according to one embodiment of the invention, and FIG. 3B is a cross-sectional view taken along line I-I' of FIG. 3A.

Referring to FIGS. 3A and 3B, the common electrode COM according to one embodiment of the invention includes a plurality of electrodes divided into a first direction (for example, x or y axis direction) and a second direction (for example, y or x axis direction) crossing the first direction). The plurality of electrodes constituting the common electrode COM include a plurality of first touch sensing electrodes R11, R21, R31, ..., R81 and a plurality of second touch sensing electrodes R12, R22, R32, ..., R82. Accordingly, the first and second touch sensing electrodes R11, R21, R31, ..., R81 and R12, R22, R32, ..., R82 serve as the common electrode COM.

The first touch sensing electrodes R11, R21, ..., R81 are connected to each other in the second direction by first sensing electrode connecting wires Ry1, Ry2, and Ry3. The second touch sensing electrodes R12, R22, ..., R82 are also connected to each other in the second direction by second sensing electrode connecting wires Ry4, Ry5, and Ry6. FIG. 3A illustrates one example of two touch sensing electrode lines including a first touch sensing electrode line constituted by the first touch sensing electrodes R11, R21, ..., R81 and the first sensing electrode connecting wires Ry1, Ry2 and Ry3, and a second touch sensing electrode line constituted by the second touch sensing electrodes R12, R22, ..., R82 and the first sensing electrode connecting wires Ry4, Ry5 and Ry6.

In the example of FIG. 3A, three sensing electrode connecting wires Ry1, Ry2 and Ry3 are used to connect the first touch sensing electrodes R11, R21, ..., and R81 in the second direction, and three sensing electrode connecting wires Ry4, Ry5 and Ry6 are used to connect the second touch sensing electrodes R12, R22, ..., and R82 in the second direction. However the construction of the touch sensing electrode lines is not limited to the example of FIG. 3A. For example, the touch sensing electrode lines may be formed of three or more. Also, one or two sensing electrode connecting wires may be used to constitute each of touch sensing electrode lines, otherwise four or more sensing electrode connecting wires may be used to constitute each of the touch sensing electrode lines. It is possible to reduce electrical resistance of the touch sensing electrodes if the number of the sensing electrode connecting wires increases.

Touch driving electrodes Tx1, Tx2, ... Tx8 constituting the touch sensor are formed in parallel to each other in the first direction to crossing over the first and second sensing electrode connecting wires Ry1, Ry2, ..., Ry6. Also, the touch driving electrode Tx1 is disposed between the first touch sensing electrodes R11 and R21, and between the second touch sensing electrodes R12 and R22. The touch driving electrode Tx2 is disposed between the first touch sensing electrodes R21 and R31, and between the second touch sensing electrodes R22 and R32. The touch driving electrode Tx2 is disposed between the first touch sensing electrodes R21 and R31, and between the second touch sensing electrodes R22 and R32. The touch driving electrode Tx3 is disposed between the first touch sensing electrodes R31 and R41, and between the second touch sensing electrodes R32 and R42. The touch driving electrode Tx4 is disposed between the first touch sensing electrodes R41 and R51, and between the second touch sensing electrodes R42 and R52. The touch driving electrode Tx5 is disposed between the first touch sensing electrodes R51 and R61, and between the second touch sensing electrodes R52 and R62. The touch driving electrode Tx6 is disposed between the first touch sensing electrodes R61 and R71, and between the second touch sensing electrodes R62 and R72. The touch driving electrode Tx7 is disposed between the first touch sensing electrodes R71 and R81, and between the second touch sensing electrodes R72 and R82. The touch driving electrode Tx8 is disposed outside of the first touch sensing electrode R81, and between the second touch sensing electrode R82. The touch driving electrode Tx8 may be omitted. The touch driving electrodes Tx1, Tx2, . . . Tx8 may be connected to each other in two or more crossings by driving electrode connecting wires. FIG. 3A illustrates one example in which four touch driving electrodes Tx1 to Tx4 and Tx5 to Tx8 are connected to each other by driving electrode connecting wires Ty1 and Ty2, respectively, thereby constituting a first touch driving electrode line Tx1 to Tx4 and Ty1, and a second touch driving electrode line Tx5 to Tx8 and Ty2.

As mentioned above, the touch sensor according to the embodiment of the invention includes the touch sensing electrodes R11, R21, . . . , R81 and R12, R22, . . . , R82, and the touch driving electrodes Tx1, Tx2, . . . Tx8. Touch recognition blocks for touch recognition may be formed by appropriately grouping the touch sensing electrodes and the driving electrodes using the sensing electrode connecting wires and the driving electrode connecting wires. FIG. 3A illustrates an example in which four touch recognition blocks TU11, TI12, TU21 and TU22 are formed by the first and second touch sensing electrodes R11, R21, . . . , R81 and R12, R22, . . . , R82, the sensing electrode connecting wires Ry1 to Ry6, the touch driving electrodes Tx1 to Tx8, and the driving electrode connecting wires Ty1 and Ty2. In more detail, the first touch recognition block TU11 is formed by the first touch sensing electrodes R11, R21, R31, R41, the sensing electrode connecting wires Ry1 to Ry3, the touch driving electrodes Tx1 to Tx4, and the driving electrode connecting wires Ty1. The second touch recognition block TU12 is formed by the second touch sensing electrodes R12, R22, R32, R42, the sensing electrode connecting wires Ry4 to Ry6, the touch driving electrodes Tx5 to Tx8, and the driving electrode connecting wires Ty1. The third touch recognition block TU21 is formed by the first touch sensing electrodes R51, R61, R71, R81, the sensing electrode connecting wires Ry1 to Ry3, the touch driving electrodes Tx5 to Tx8, and the driving electrode connecting wires Ty2. The fourth touch recognition block TU22 is formed by the first touch sensing electrodes R52, R62, R72, R82, the sensing electrode connecting wires Ry4 to Ry6, the touch driving electrodes Tx5 to Tx8, and the driving electrode connecting wires Ty2.

Each of the first and second touch sensing electrodes R11, R21, . . . , R81 and R12, R22, . . . , R82 is formed to have a size corresponding to a few or several tens of pixel electrodes P. The pixel electrodes P are formed in regions defined by crossing of the gate lines G1 to Gm and the data lines D1 to Dn. The gate lines G1 to Gm and the data lines D1 to Dn are omitted from FIGS. 3A and 3B to simplify description.

The first touch sensing electrode line R11, R21, . . . R81, Ry1 to Ry3 and the second touch sensing electrode line R12, R22, . . . R82, Ry4 to Ry6 are connected to the power supply unit 15 to receive common voltage Vcom during display driving operation. Also, the first touch sensing electrode line R11, R21, . . . R81, Ry1 to Ry3 recognize a variation amount of mutual capacitance between the first touch sensing line R11, R21, . . . R81, Ry1 to Ry3 and the first and second touch driving line Tx1 to Tx4, Ty1 and Tx5 to Tx8, Ty2 before and after touch, and supply it to the touch recognition processor 17 during touch driving operation. The second touch sensing electrode line R12, R22, . . . R82, Ry4 to Ry6 recognize a variation amount of mutual capacitance between the second touch sensing line R12, R22, . . . R82, Ry4 to Ry6 and the first and second touch driving line Tx1 to Tx4, Ty1 and Tx5 to Tx8, Ty2 before and after touch, and supply it to the touch recognition processor 17 during touch driving operation.

The first and second driving electrode lines Tx1 to Tx4, Ty1 and Tx5 to Tx8, Ty2 are connected to the power supply unit 15 to receive a touch driving voltage Vtsp during the touch driving operation.

Referring again to FIG. 1, the gate driver 13 sequentially outputs a gate pulse (or a scan pulse) under the control of the timing controller 11 in a display mode. The gate driver 13 shifts a swing voltage of the gate pulse to a gate high voltage VGH and a gate low voltage VGL. The gate pulse output from the gate driver 13 is synchronized with the data voltage output from the data driver 12 and is sequentially supplied to the gate lines G1 to Gm. The gate high voltage VGH is equal to or greater than a threshold voltage of the TFT, and the gate low voltage VGL is less than the threshold voltage of the TFT. A plurality of gate driving integrated circuits (ICs) of the gate driver 13 may be connected to the gate lines G1 to Gm formed on the first substrate SUBS1 of the TFT array TFTA through a tape automated bonding (TAB) process. Alternatively, the gate driving ICs of the gate driver 13 may be directly formed on the first substrate SUBS1 of the TFT array TFTA along with pixels through a gate-in-panel (GIP) process.

The data driver 12 samples and latches digital video data RGB under the control of the timing controller 11. The data driver 12 converts the digital video data RGB into positive and negative gamma compensation voltages GMA1 to GMAn and inverts a polarity of the data voltage. The positive and negative data voltages output from the data driver 12 are synchronized with the gate pulses output from the gate driver 13. A plurality of source driving ICs of the data driver 12 may be connected to the data lines D1 to Dn formed on the first substrate SUBS1 of the TFT array TFTA through a chip-on glass (COG) process or the TAB process. The source driving ICs may be integrated inside the timing controller 11 and thus may be implemented as a single chip IC along with the timing controller 11.

The timing controller 11 generates timing control signals for controlling operation timings of the gate driver 13 and the data driver 12 using timing signals Vsync, Hsync, DE, and MCLK, which are received from the external host controller 10 and are used to drive the touch sensor integrated type liquid crystal display. The timing control signals include a gate timing control signal for controlling the operation timing of the gate driver 13 and a data timing control signal for controlling the operation timing of the data driver 12 and the polarity of the data voltage.

The gate timing control signal includes a gate start pulse GSP, a gate shift clock GSC, a gate output enable GOE, and the like. The gate start pulse GSP is applied to a first gate driving IC of the gate driver 13 to output a first gate pulse in each frame period and controls a shift start timing of the first gate driving IC. The gate shift clock GSC is commonly input to the gate driving ICs of the gate driver 13 and also shifts the gate start pulse GSP. The gate output enable GOE controls output timings of the gate driving ICs of the gate driver 13.

The data timing control signal includes a source start pulse SSP, a source sampling clock SSC, a polarity control signal POL, a source output enable SOE, and the like. The source start pulse SSP is applied to a first source driving IC of the data driver 12 to firstly sample the data and controls a data sampling start timing. The source sampling clock SSC controls a sampling timing of data inside the source driving ICs based on a rising or falling edge thereof. The polarity control signal POL controls the polarity of the data voltage output from the source driving ICs. The source output enable SOE controls output timings of the source driving ICs. If the digital video data RGB is input to the data driver 102 through a mini low voltage differential signaling (LVDS) interface, the source start pulse SSP and the source sampling clock SSC may be omitted.

The power supply unit 15 is implemented as a DC-DC converter including a pulse width modulation (PWM) circuit, a boost converter, a regulator, a charge pump, a voltage divider, an operational amplifier, etc. The power supply unit 15 regulates a voltage input from the host controller 10 and generates voltages required to drive the liquid crystal display panel LCP, the data driver 12, the gate driver 13, the timing controller 11, and the backlight unit (not shown).

The voltages generated by the power supply unit 15 include a high potential power voltage VDD, the gate high voltage VGH, the gate low voltage VGL, a common voltage Vcom, positive and negative gamma reference voltages GMA1 to GMAn, a touch driving voltage Vtsp, and the like. The common voltage Vcom is supplied to the common electrode COM under the control of the host controller 10 during a display driving operation. Alternatively, the common voltage Vcom may be supplied to the common electrode COM under the control of the timing controller 11 during a display driving operation. The touch driving voltage Vtsp is supplied to the touch driving electrodes Tx1 to Tx8 under the control of the host controller 10 during a touch driving operation. Alternatively, touch driving voltage Vtsp may be supplied to the touch driving electrodes Tx1 to Tx8 under the control of the timing controller 11 during a touch driving operation.

In the embodiment shown in FIG. 1, the touch driving voltage Vtsp is supplied to the touch driving electrodes Tx1 to Tx8 through the power supply unit 15, but the invention is not limited thereto. For example, the touch driving voltage Vtsp is supply to the touch driving electrodes Tx1 to Tx8 through the touch recognition processor 17 under the control of the host controller 10 or the timing controller 11.

The host controller 10 transfers the digital video data RGB of an input image and the timing signals Vsync, Hsync, DE, and MCLK driving the touch sensor integrated type liquid crystal display to the timing controller 11 through an interface, such as the LVDS interface and a transition minimized differential signaling (TMDS) interface. When the touch sensor integrated type liquid crystal display is driven so as to display the image on its screen, the host controller 100 supplies control signal Vin for controlling the power supply unit 15, so that the common voltage Vcom can be supplied to the common electrode COM. When the touch sensor integrated type liquid crystal display is driven for the touch recognition, the host controller 10 supplies a control signal Vin for controlling the power supply unit 15, so that the touch driving voltage Vtsp can be supplied to the touch driving electrodes Tx1 to Tx8.

The touch recognition processor 17 differentially amplifies a difference voltage between a voltage of an initial capacitance measured through each of the first and second touch sensing lines before a touch operation and a voltage of a touch capacitance measured through each of the first and second touch sensing lines after the touch operation. The touch recognition processor 17 then converts the result of a differential amplification into digital data. The touch recognition processor 17 decides a touch position based on a difference between the initial capacitance and the touch capacitance using a touch recognition algorithm and outputs touch coordinate data indicating the touch position to the host controller 10.

Figure 4A:
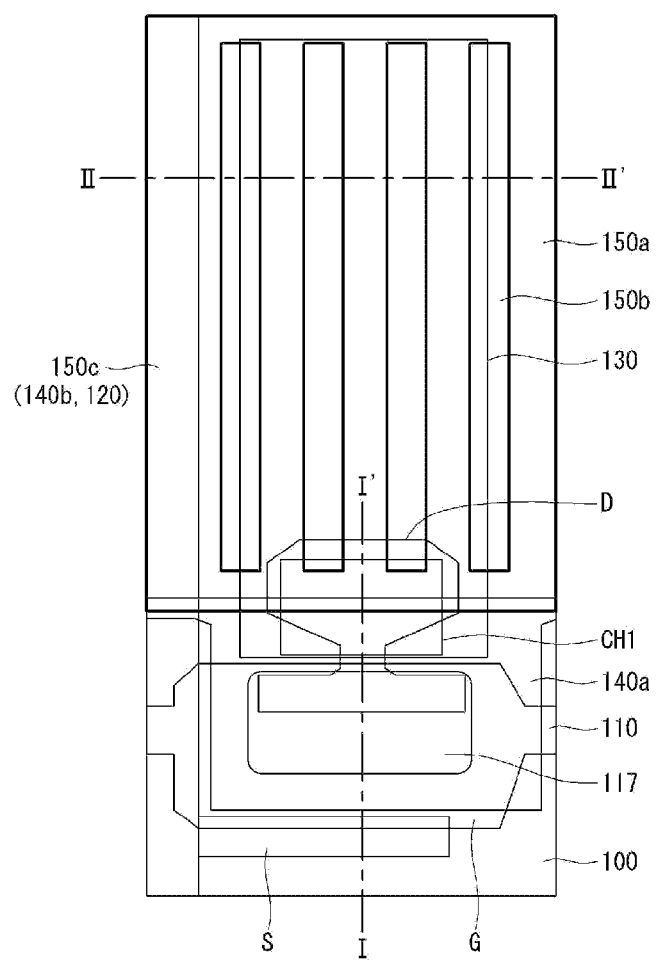
FIG. 4A is a top plan view illustrating one sub-pixel region of the touch sensor integrated type display device according to the embodiment of the invention.
Figure 4B:
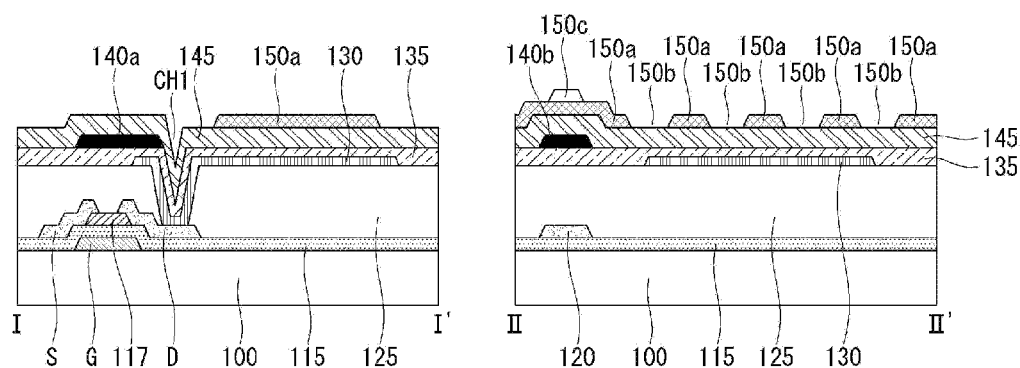
FIG. 4B is a cross-sectional view taken along line II-II' of FIG. 4A.

The touch sensor integrated type display device according to the embodiment of the invention will be described in detail with reference to FIGS. 4A and 4B. FIG. 4A is a top plan view illustrating one sub-pixel region of the touch sensor integrated type display device according to one embodiment of the invention, and FIG. 4B is a cross-sectional view taken along line II-II' of FIG. 4A. In the embodiment shown in FIGS. 4A and 4B, the color filter array CFA is omitted to obviate complexity of description because the touch sensor including the touch sensing electrodes and the touch driving electrodes is formed on the TFT array TFTA shown in FIGS. 1 and 2.

Referring to FIGS. 4A and 4B, the touch sensor integrated type display device according to one embodiment of the invention includes a gate line 110 and a data line 120 crossing over each other and formed on the first substrate SUBS1, a thin film transistor disposed adjacent to a cross-area of the gate line 110 and the data line 120, a pixel electrode 130 formed in an area defined by cross of the gate line 110 and the data line 120, a touch driving electrode 140a overlapped with and parallel to the gate line 110, a touch sensing electrode 150a arranged between the touch driving electrodes 140a without contacting with the touch driving electrode 140a. In one embodiment of the invention, the touch sensing electrode 150a serves as also the common electrode of the display device, but it is referred to as touch sensing electrode for convenience.

In the construction, the thin film transistor includes a gate electrode G extended from the gate line 110, a semiconductor pattern 117 formed on a gate insulation layer 115 covering the gate line 110 and the gate electrode G so as to be overlapped with a portion of the gate electrode G, a source electrode S extended from the data line 120, and a drain electrode opposite to the source electrode S.

The pixel electrode 130 is formed on a first passivation layer 125 and is contacted with the drain electrode D which is exposed through a first contact hole CH1 passing through the first passivation layer 125.

The touch driving electrode 140a (corresponding to any one of Tx1 to Tx8 shown in FIG. 3A) is formed on a second passivation layer 135 covering the pixel electrode 130. The touch driving electrodes 140a are paralleled with a first direction (x or y axis direction) and connected to each other in a predetermined number by a driving electrode connecting wire 140b which is arranged in a second direction (y or x axis direction). In the embodiment of the invention, four touch driving electrodes Tx1 to Tx4 or Tx5 to Tx8 are connected to each other by one driving electrode connecting wire Ty1 or Ty2 as shown in FIG. 3A.

The touch sensing electrode 150a (corresponding to any one of R11, R21, . . . , R81, R12, R22, . . . , R82 shown in FIG. 3A) is formed on a third passivation layer 145 covering the touch driving electrode 140a and the driving electrode connection wire 140b. The touch sensing electrodes 150a are connected to each other at a predetermined number of crossings by at least one sensing electrode connecting wire 150c. In one embodiment of the invention, the first touch sensing electrodes R11, R21, . . . , R81 arranged in the second direction are connected to each other by three sensing electrode connecting wire Ry1 to Ry3 in parallel with the second direction as shown in FIG. 3A. Also, the second touch sensing electrodes R12 R22, . . . , R82 arranged in the second direction are connected to each other by three sensing electrode connecting wire Ry4 to Ry6 in parallel with the second direction.

In one embodiment of the invention shown in FIGS. 4A and 4B, the touch sensing electrode 150a includes a plurality of openings 150b, which elongate in an area overlapping the pixel electrode 130 to be spaced apart from each other at a predetermined distance, but the invention is not limited thereto. For example, the pixel electrode 130 may include the plurality of openings 150b. In this case, the touch sensing electrode 150a does not include any opening.

As described above, the touch sensor integrated type display device according to the embodiment of the invention has a construction in which the touch driving electrode lines are formed in the first direction and the touch sensing electrode lines are formed in the second direction because the touch driving electrodes are connected to each other by the driving electrode connecting wire to form the touch driving electrode lines in the first direction and the touch sensing electrodes are connected to each other by the sensing electrode connecting wire to form the touch sensing electrode lines in the second direction. Accordingly, if a touch is performed on the touch sensor integrated type display device, it is possible to detect the position where the touch is performed by detecting the difference of mutual capacitance generated between the touch driving electrode lines and the touch sensing electrode lines.

Hereinafter, a method of manufacturing the touch sensor integrated type display device according to an exemplary embodiment of the invention will be described with reference to FIGS. 5A to 12B. It is described with respect to one sub-pixel region for convenience. Also, although one sub-pixel region is defined by one pair of gate lines adjacent to each other and one pair of data lines adjacent to each other, one gate line and one data line are shown in the drawings for convenience.

Figure 5A:
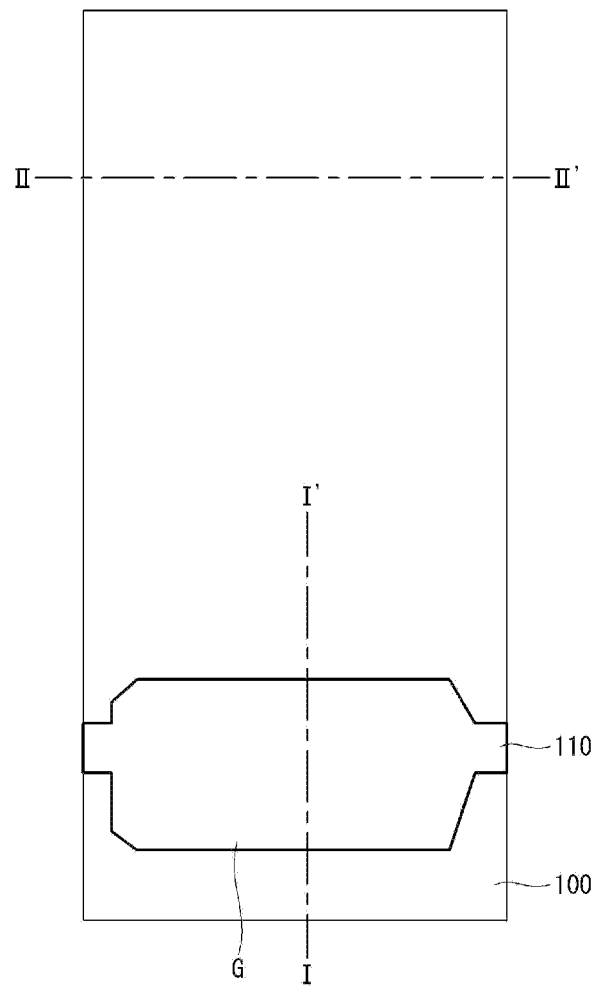
FIG. 5A is a top plan view illustrating a first mask process for manufacturing the touch sensor integrated type display device according to the embodiment of the invention.
Figure 5B:
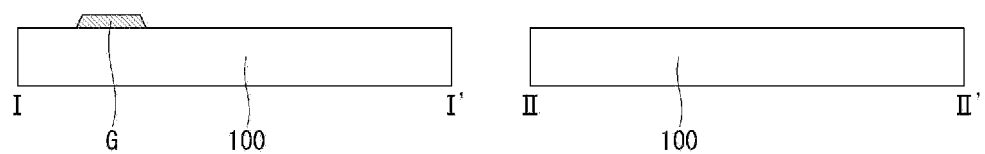
FIG. 5B is a cross-sectional view taken along lines I-I' and II-II' shown in FIG. 5A.

FIG. 5A is a top planar view illustrating a first mask process for manufacturing the touch sensor integrated type display device according to one embodiment of the invention, and FIG. 5B is a cross-sectional view taken along lines I-I' and II-II' shown in FIG. 5A.

Referring to FIGS. 5A and 5B, a gate metal layer is entirely deposited on a first substrate 110 through a deposition process as a first conductive layer. A gate line 110 and a gate electrode G extended from the gate line 110 are formed on the substrate 100 using the first mask process.

More specifically, a gate metal layer is formed on the entire surface of the substrate 100 as a first conductive layer by a deposition process such as a sputtering process. After a photoresist is entirely applied to the substrate 100 on which the first conductive layer is deposited, a first photoresist pattern (not shown) exposing a portion of the first conductive layer is formed through a photolithography process using a first mask. The first conductive layer exposed via the first photo resist pattern is removed by a wet etching. The first photo resist pattern is then removed by an ashing process, thereby forming the gate line 110 and the gate electrode G on the substrate 100. The first conductive layer may be formed using a metal material such as Al, AlNd, Mo, MoTi, Cu, or Cr.

Figure 6A:
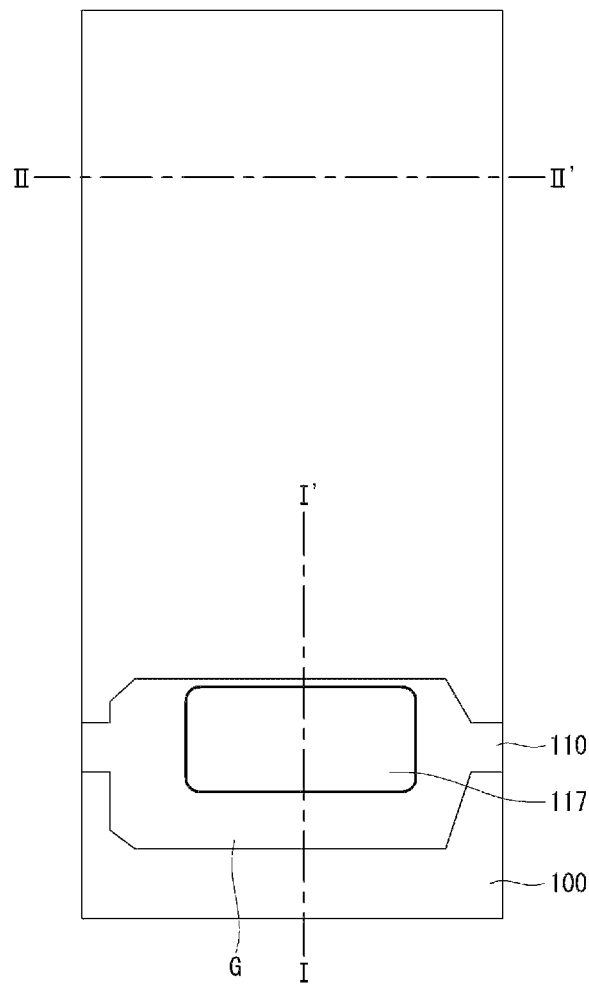
FIG. 6A is a top planar view illustrating a second mask process for manufacturing the touch sensor integrated type display device according to the embodiment of the invention.
Figure 6B:
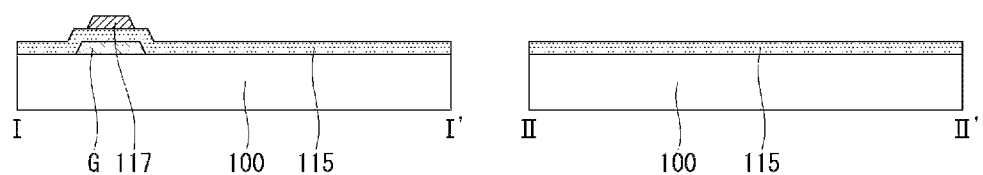
FIG. 6B is a cross-sectional view taken along lines I-I' and II-II' shown in FIG. 6A.

FIG. 6A is a top planar view illustrating a second mask process for manufacturing the touch sensor integrated type display device according to one embodiment of the invention, and FIG. 6B is a cross-sectional view taken along lines I-I' and II-II' shown in FIG. 6A.

Referring to FIGS. 6A and 6B, a gate insulation layer 115 is formed on an entire surface of the substrate 100 on which the gate line 110 and the gate electrode G are formed. A semiconductor layer is then entirely formed on the gate insulation layer 115. A photoresist layer is entirely formed on the semiconductor layer, and a second photoresist pattern (not shown) is formed to expose regions of the semiconductor layer excluding a channel region through a photolithography process using a second mask. The semiconductor layer exposed via the second photoresist pattern is removed by an etching process. The second photo resist pattern is then removed by an ashing process, thereby forming the semiconductor pattern 117.

Figure 7A:
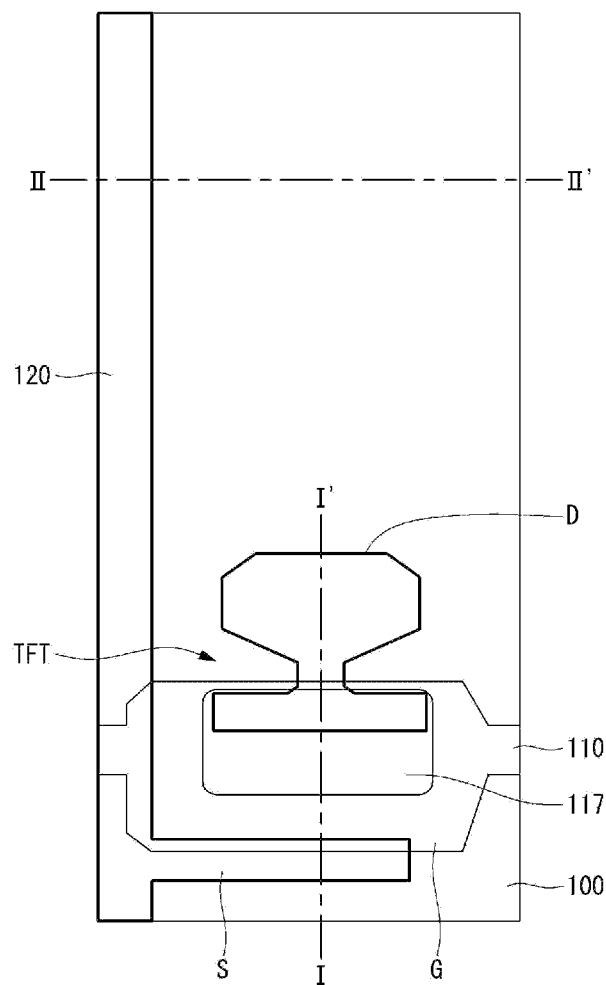
FIG. 7A is a top planar view illustrating a third mask process for manufacturing the touch sensor integrated type display device according to the embodiment of the invention.
Figure 7B:
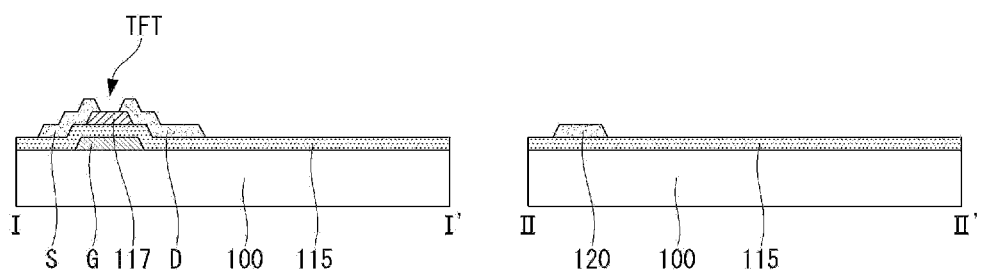
FIG. 7B is a cross-sectional view taken along lines I-I' and II-II' shown in FIG. 7A.

FIG. 7A is a top plan view illustrating a third mask process for manufacturing the touch sensor integrated type display device according to one embodiment of the invention, and FIG. 7B is a cross-sectional view taken along lines I-I' and II-II' shown in FIG. 7A.

Referring to FIGS. 7A and 7B, a data metal layer is formed as a second conductive layer on the gate insulation layer 115 on which the semiconductor pattern 117 is formed. A photoresist is entirely deposited on the second conductive layer, and a third photoresist pattern (not shown) is formed through a photolithography process using a third mask. The third photoresist pattern exposes regions of the second conductive layer excluding regions on which a data line, a source electrode and a drain electrode are to be formed. The data line 120 and a thin film transistor TFT including the source electrode S extended from the data line and a drain electrode D are formed by etching the second conductive layer exposed via the third photoresist pattern and removing the third photo resist pattern remained on the second conductive layer. The data line 120 crosses over the gate line 110 with the gate insulation layer 115 therebetween. The source electrode S is extended from the data line 120 and the drain electrode D is opposite to the source electrode S.

Figure 8A:
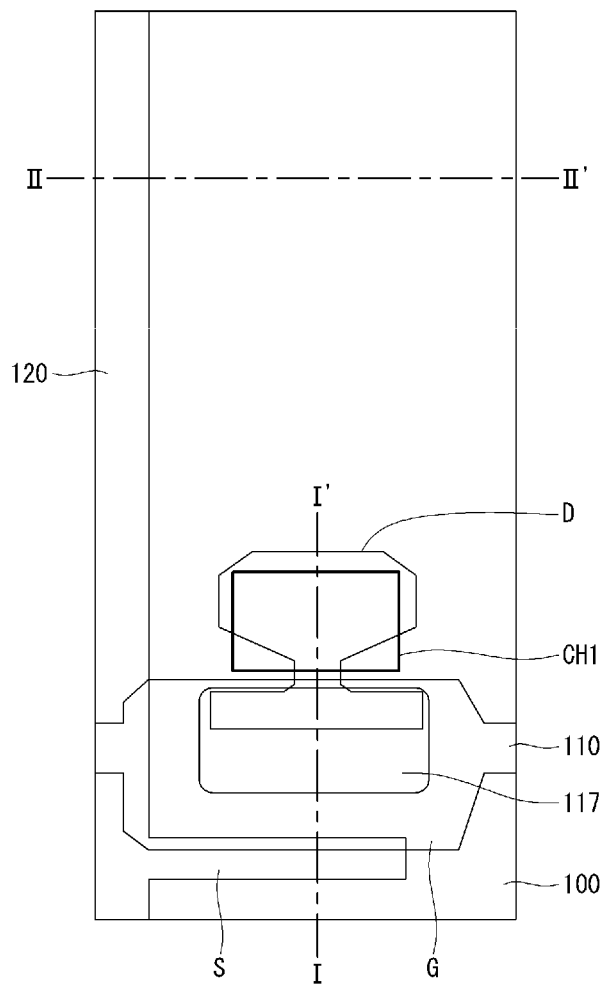
FIG. 8A is a top planar view illustrating a fourth mask process for manufacturing the touch sensor integrated type display device according to the embodiment of the invention.
Figure 8B:
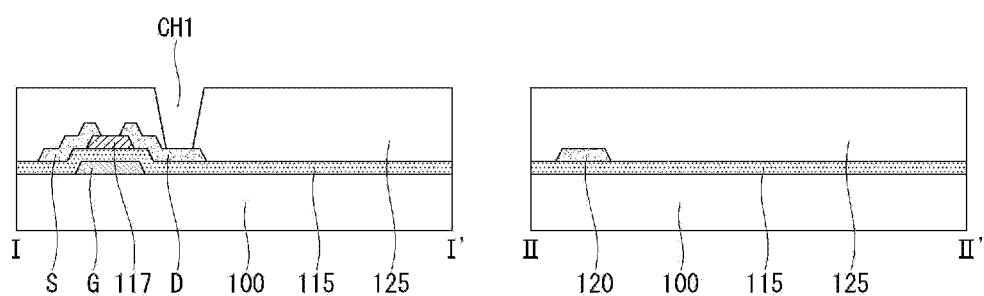
FIG. 8B is a cross-sectional view taken along lines I-I' and II-II' shown in FIG. 8A.

FIG. 8A is a top plan view illustrating a fourth mask process for manufacturing the touch sensor integrated type display device according to one embodiment of the invention, and FIG. 8B is a cross-sectional view taken along lines I-I' and II-II' shown in FIG. 8A.

Referring to FIGS. 8A and 8B, a first passivation layer 125 is entirely formed on the gate insulation layer 115 on which the data line 120 and the thin film transistor TFT are formed. A photoresist layer is entirely formed on the first passivation layer 125, and a fourth photoresist pattern (not shown) is formed to expose a portion of the drain electrode D through a photolithography process using a fourth mask. A first contact hole CH1 exposing the portion of the drain electrode D is then formed in the first passivation layer 125 by etching the first passivation layer 125 exposed via the fourth photoresist pattern and removing the fourth photoresist pattern. The first passivation layer 125 may be made of a low dielectric organic material such as polyanionic cellulose (PAC).

Figure 9A:
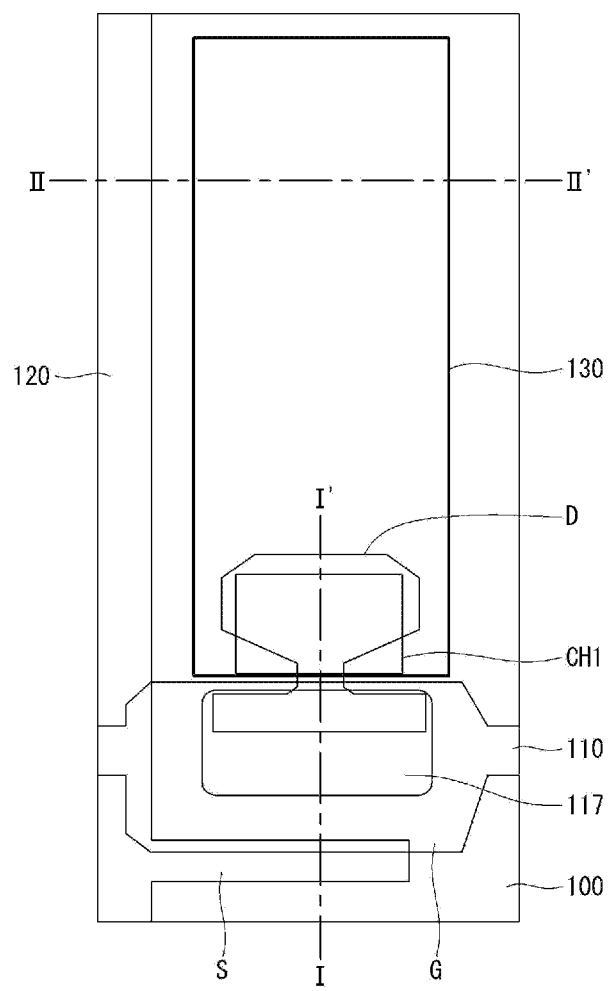
FIG. 9A is a top planar view illustrating a fifth mask process for manufacturing the touch sensor integrated type display device according to the embodiment of the invention.
Figure 9B:
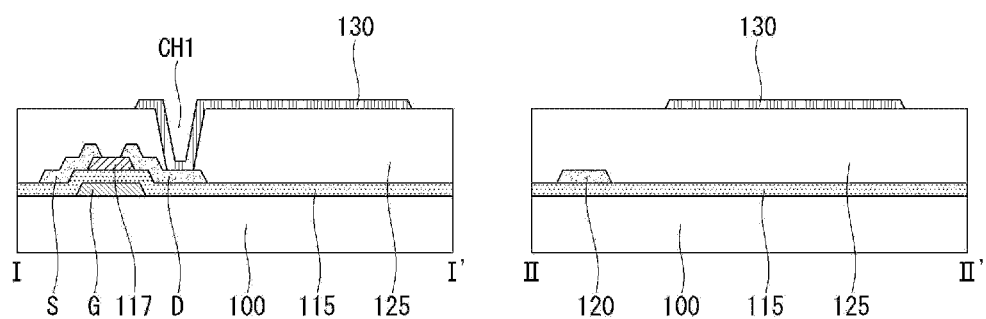
FIG. 9B is a cross-sectional view taken along lines I-I' and II-II' shown in FIG. 9A.

FIG. 9A is a top plan view illustrating a fifth mask process for manufacturing the touch sensor integrated type display device according to one embodiment of the invention, and FIG. 9B is a cross-sectional view taken along lines I-I' and II-II' shown in FIG. 9A.

Referring to FIGS. 9A and 9B, a first transparent conductive layer is entirely formed as a third conductive layer on the first passivation layer 125 in which the first contact hole CH1 is formed through a deposition process such as a plasma-enhanced chemical vapor deposition (PECVD). A photoresist layer is entirely formed on the first transparent conductive layer, and a fifth photoresist pattern (not shown) is formed through a photolithography process using a fifth mask. The fifth photoresist pattern exposes regions of the first transparent conductive layer excluding regions on which a pixel electrode is to be formed. The pixel electrode 130 is formed by etching the first transparent conductive layer exposed via the fifth photoresist pattern and removing the fifth photoresist pattern remaining on the first transparent conductive layer. The pixel electrode 130 is connected with the drain electrode D exposed through the first contact hole CH1 formed in the first passivation layer 125. The pixel electrode 130 may be made of a transparent conductive material such as indium tin oxide (ITO), indium zinc oxide (IZO), and gallium-doped zinc oxide (GZO).

Figure 10A:
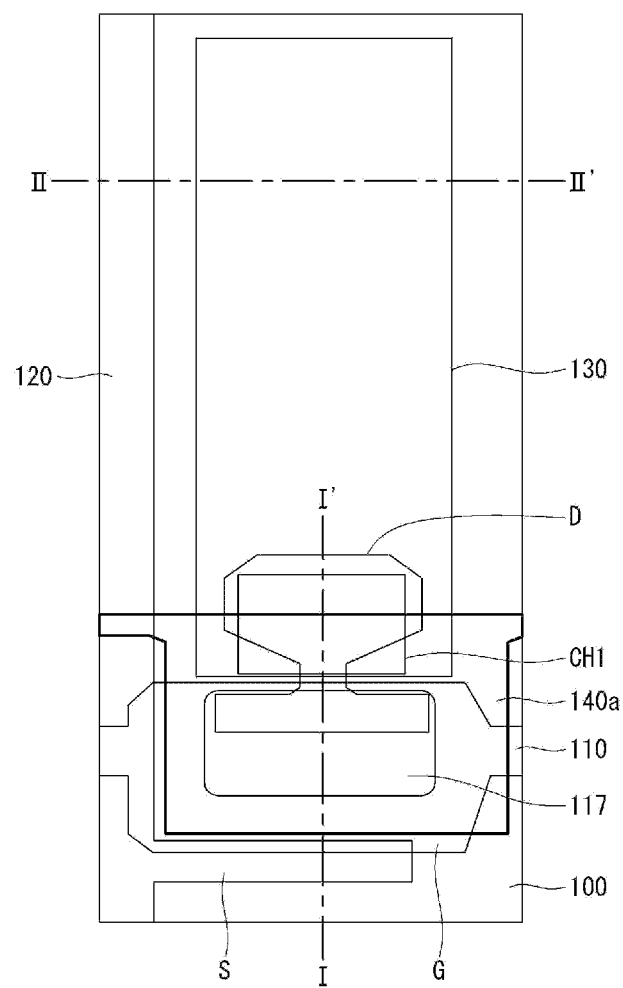
FIG. 10A is a top planar view illustrating a sixth mask process for manufacturing the touch sensor integrated type display device according to the embodiment of the invention.
Figure 10B:
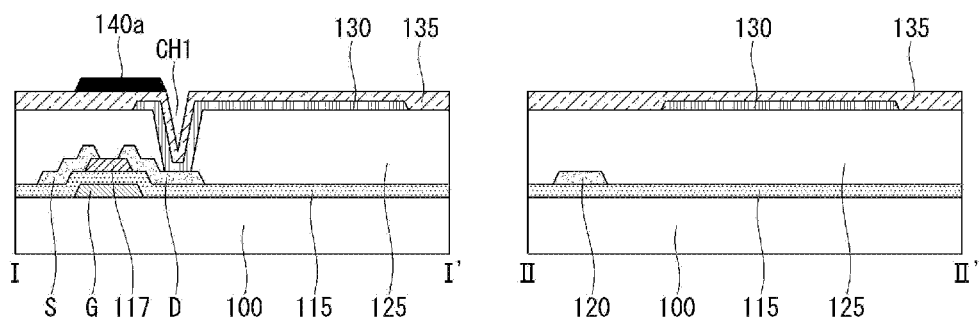
FIG. 10B is a cross-sectional view taken along lines I-I' and II-II' shown in FIG. 10A.

FIG. 10A is a top planar view illustrating a sixth mask process for manufacturing the touch sensor integrated type display device according to one embodiment of the invention, and FIG. 10B is a cross-sectional view taken along lines I-I' and II-II' shown in FIG. 10A.

Referring to FIGS. 10A and 10B, a second passivation layer 135 is entirely formed on the first passivation layer 125 on which the pixel electrode 130 is formed. A fourth conductive layer is entirely formed on the second passivation layer 135 through a deposition process such as a sputtering process. A photoresist is entirely formed on the fourth conductive layer, and a sixth photo resist pattern (not shown) is formed to expose regions of the fourth conductive layer excluding a region in which a touch driving electrode 140a is to be formed through a photolithography process using a sixth mask. The fourth conductive layer exposed via the sixth photoresist pattern is etched, and the touch driving electrode 140a is formed by removing the sixth photoresist pattern. The touch driving electrode 140a is formed in parallel to and overlapping with the gate line 110. The touch driving electrode 140a may be made of a metal material such as Cu, CuOx, Al, AlNd, Mo, MoTi, or Cr.

Figure 11A:
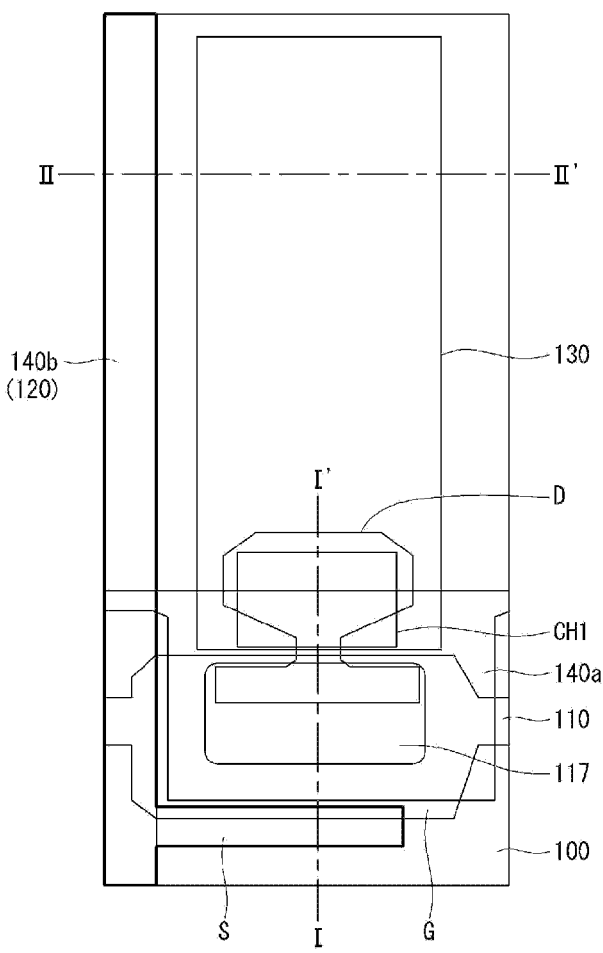
FIG. 11A is a top planar view illustrating a seventh mask process for manufacturing the touch sensor integrated type display device according to the embodiment of the invention.
Figure 11B:
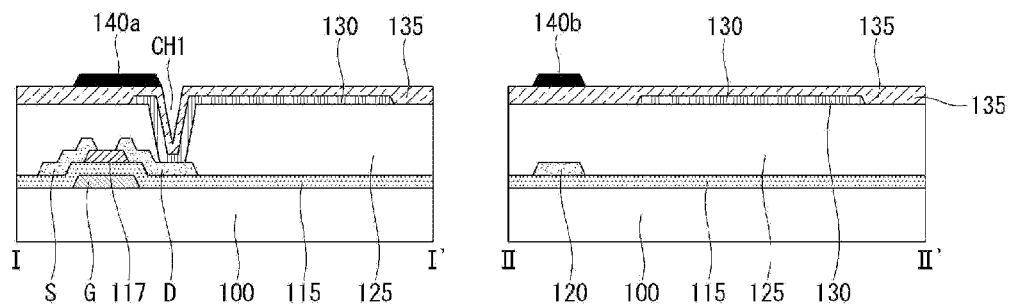
FIG. 11B is a cross-sectional view taken along lines I-I' and II-II' shown in FIG. 11A.

FIG. 11A is a top plan view illustrating a seventh mask process for manufacturing the touch sensor integrated type display device according to one embodiment of the invention, and FIG. 11B is a cross-sectional view taken along lines I-I' and II-II' shown in FIG. 11A.

Referring to FIGS. 11A and 11B, a fifth conductive layer is entirely formed on the second passivation layer 125 on which the touch driving electrode 140a is formed through a deposition process such as a sputtering process. A photoresist is entirely formed on the fifth conductive layer, and a seventh photoresist pattern (not shown) is formed through a photolithography process using a seventh mask. The fifth conductive layer exposed via the seventh photoresist pattern is etched, and a driving electrode connecting wire 140b is formed by removing the seventh photoresist pattern. The driving electrode connecting wire 140b is formed in parallel and overlapping with the data line 120. Also, the driving electrode connecting wire 140b is formed to be intersecting with the touch driving electrode 140a. The connection relationship between the touch driving electrode 140a and the driving electrode connecting wire 140b is shown in FIG. 3A. As illustrated in FIG. 3A, the first driving electrode connecting wire Ty1 is connected to the ends of the first touch driving electrodes Tx1 to Tx4, and the second driving electrode connecting wire Ty2 is connected to the ends of the first touch driving electrodes Tx5 to Tx8. Therefore, the touch driving electrodes may be appropriately grouped by the driving electrode connecting wires. The driving electrode connecting wire 140b may be made of a metal material such as Cu, CuOx, Al, AlNd, Mo, MoTi, or Cr.

In one embodiment of the invention, the touch driving electrode and the driving electrode connecting wire are described as being respectively formed by independent mask processes. But the invention is not limited thereto. For example, the touch driving electrode and the driving electrode connecting wire may be formed at one time by one mask process. In the case of using two masks, it is possible to use different materials to form the touch driving electrode and the driving connecting wire. Therefore, it is advantageous in that various materials can be used. On the other hand, in the case of using one mask, it is possible to use one mask process to form the touch driving electrode and the driving connecting wire. Therefore, by eliminating one mask process, the manufacturing cost can be reduced.

Figure 12A:
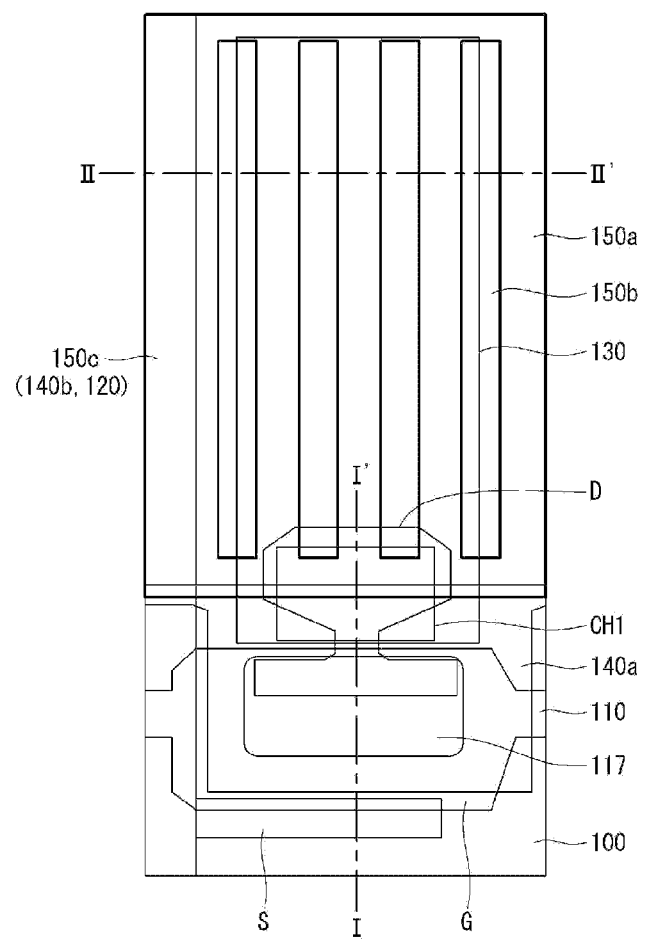
FIG. 12A is a top planar view illustrating a eighth mask process for manufacturing the touch sensor integrated type display device according to the embodiment of the invention.
Figure 12B:
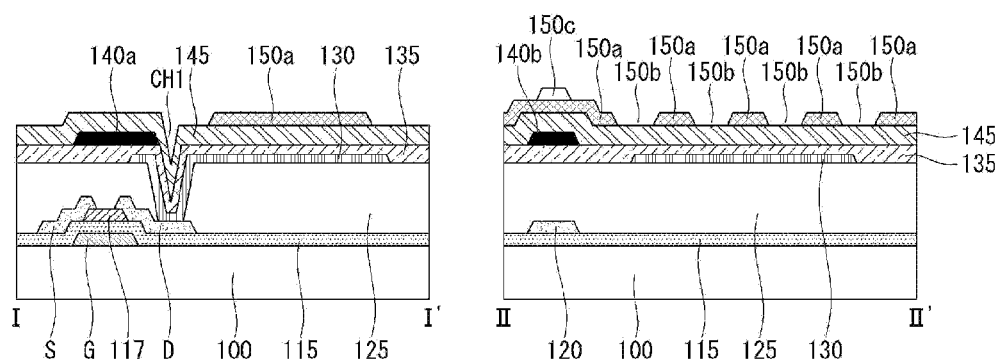
FIG. 12B is a cross-sectional view taken along lines I-I' and II-II' shown in FIG. 12A.

FIG. 12A is a top planar view illustrating a eighth mask process for manufacturing the touch sensor integrated type display device according to one embodiment of the invention, and FIG. 12B is a cross-sectional view taken along lines I-I' and II-II' shown in FIG. 12A.

Referring to FIGS. 12A and 12B, a third passivation layer 145 is entirely formed on the second passivation layer 135 on which the touch driving electrode 140a and the driving electrode connecting wire 140b are formed. A second transparent conductive layer as a sixth conductive layer and a metal layer as a seventh conductive layer are then sequentially formed on an entire surface of the third passivation layer 145 through a deposition process. A photoresist layer is entirely formed on the fifth transparent conductive layer, and an eight photoresist pattern (not shown) is formed through a photolithography process using a half-tone mask. The eighth photoresist pattern is formed to expose regions of the seventh conductive layer excluding the regions in which a touch sensing electrode 150a (corresponding to any one of touch sensing electrodes R11, R21, . . . , R81, R12, R22, . . . , and R82 shown in FIG. 3A) and a sensing electrode connecting wire 150c are to be formed. The seventh conductive layer and the second transparent conductive layer are etched, and the touch sensing electrode 150a and the sensing electrode connecting wire 150c (corresponding to any one of the sensing electrode connecting wires shown in FIG. 3A) are formed by removing the eighth photoresist pattern. The touch sensing electrode 150a has a plurality of openings 150b, and the sensing electrode connecting wire 150c connects a predetermined number of touch sensing electrodes 150a to each other. The connection relationships between the touch driving electrode and the driving electrode connecting wire, and the touch sensing electrode and the sensing electrode connecting wire, are described in detail in relation to FIGS. 3A and 3B.

In one embodiment of the invention, it is described that the touch sensing electrode 150a and the sensing electrode connecting wire 150c are formed by the half-tone mask process, but the invention is not limited thereto. For example, the touch sensing electrode 150a and the sensing electrode connecting wire 150c may be formed by independent mask processes. Also, the touch sensing electrode may be formed earlier than the sensing electrode connecting wire. To this end, after the touch sensing electrode has been formed on the third passivation layer 145, the fourth passivation layer 145 may be formed to cover the touch sensing electrode. The sensing electrode connecting wires may then be formed on the fourth passivation layer 145. The fourth passivation layer 145 may have a contact hole exposing a portion of the touch sensing electrode. The sensing electrode connecting wires may be connected to the touch sensing electrode via the contact hole formed in the fourth passivation layer 145.

According to the touch sensor integrated type display device and the method of manufacturing the same, it is unnecessary to independently form the touch sensing electrodes for touch driving operation because the common electrode for driving liquid crystal can serve as the touch sensing electrode. Accordingly, it is possible to remove the process for forming the independent touch sensing electrodes, and to decrease a thickness of the display device by the thickness of the touch sensing electrode.

Also, it is possible to reduce the electrical resistance of the touch sensing electrodes R11, R21, . . . , R81, R12, R22, . . . , and R82 because the touch sensing electrodes R11, R21, . . . , and R81 made of a transparent conductive material are connected to each other by the first sensing electrode connecting wires Ry1 to Ry3 made of a metal material, and the touch sensing electrode R12, R22, . . . , and R82 made of a transparent conductive material are connected to each other by the second sensing electrode connecting wires Ry4 to Ry8. Accordingly, touch sensitivity can be improved during a touch operation.

While the invention has been described with respect to a limited number of embodiments, those skilled in the art, having benefit of the above description, will appreciate that other embodiments can be devised which do not depart from the scope of the invention as disclosed herein. Accordingly, the scope of the invention should be limited only by the attached claims.

What is claimed is:

1. A touch sensor integrated type display device comprising:
   a plurality of first electrodes arranged on a substrate in parallel in a first direction;
   a plurality of second electrodes arranged in parallel in the first direction and a second direction crossing the first direction without contacting the plurality of first electrodes;
   a plurality of first connecting wires, each first connecting wire being connected to at least one of the plurality of the first electrodes; and
   a plurality of second connecting wires, each second connecting wire connecting the second electrodes to each other in the second direction,
   wherein a touch driving voltage is supplied to the plurality of first connecting wires and a common voltage is supplied to the plurality of second connecting wires so that mutual capacitance is generated between the a plurality of first electrodes and the plurality of second electrodes.

2. The touch sensor integrated type display device of claim 1, wherein each of the plurality of second connecting wires includes at least two sub-connecting wires.

3. The touch sensor integrated type display device of claim 1, wherein the plurality of second electrodes serve as common electrodes and touch sensing electrodes.

4. The touch sensor integrated type display device of claim 1, wherein the first plurality of electrodes and the first and second connecting wires are made of a metal material selected from the group consisting of Cu, CuOx, Al, AlNd, Mo, MoTi, and Cr, and wherein the second plurality of electrodes are made of a transparent conductive material selected from the group consisting of indium tin oxide (ITO), indium zinc oxide (IZO), gallium-doped zinc oxide (GZO).

5. A touch sensor integrated type display device comprising:
   gate lines and data lines formed on a substrate to cross over each other;
   a plurality of pixel electrodes formed in areas defined by the crossing of the gate lines and the data lines;
   a plurality of first electrodes arranged in parallel with the gate lines;
   a plurality of second electrodes arranged in parallel with the gate lines and the data lines without contacting the plurality of first electrodes;
   a plurality of first connecting wires, each first connecting wire being connected with at least one of the plurality of the first electrodes; and
   a plurality of second connecting wires, each second connecting wire connecting the second electrodes to each other in parallel with the data line,
   wherein a touch driving voltage is supplied to the plurality of first connecting wires during a touch mode and a common voltage is supplied to the plurality of second connecting wires during a display mode so that mutual capacitance is generated between the plurality of first electrodes and the plurality of second electrodes.

6. The touch sensor integrated type display device of claim 5, wherein each of the plurality of second connecting wires includes at least two sub-connecting wires.

7. The touch sensor integrated type display device of claim 5, wherein the plurality of second electrodes serve as common electrodes and touch sensing electrodes.

8. The touch sensor integrated type display device of claim 5, wherein the first plurality of electrodes and the first and second connecting wires are made of a metal material selected from the group consisting of Cu, CuOx, Al, AlNd, Mo, MoTi, and Cr, and wherein the second plurality of electrodes are made of a transparent conductive material selected from the group consisting of indium tin oxide (ITO), indium zinc oxide (IZO), gallium-doped zinc oxide (GZO).

9. The touch sensor integrated type display device of claim 5, wherein any one of the pixel electrode and the second electrode includes a plurality of openings, which elongate in an area overlapping the pixel electrode to be spaced apart from each other at a predetermined distance.

10. A method of manufacturing a touch sensor integrated type display device comprising:
    forming a first conductive layer on a substrate;
    forming a gate line and a gate electrode using first mask process;
    forming a gate insulation layer on the substrate on which the gate line and the gate electrode are formed, forming a semiconductor layer on the gate insulation layer, and forming a semiconductor pattern on a region of the gate insulation layer corresponding to the gate electrode by patterning the semiconductor layer using a second mask process;
    forming a data metal layer as a second conductive layer on the gate insulation layer, and forming first conductive pattern group including a data line, a source electrode extended from the data lines and a drain electrode opposite to the source electrode by patterning the data metal layer using a third mask process;
    forming a first passivation layer on an entire surface of the gate insulation layer on which the first conductive pattern group is formed, and forming a first contact hole exposing a portion of the drain electrode by etching the first passivation layer using a fourth mask process;
    forming a first transparent conductive layer as a third conductive layer on the first passivation layer in which the first contact hole is formed, and forming a pixel electrode by patterning the first transparent conductive layer using a fifth mask process;
    forming a second passivation layer and a fourth conductive layer on the first passivation layer on which the pixel electrode is formed, and forming a plurality of first electrodes by etching the fourth conductive layer using a sixth mask process, the plurality of first electrodes being arranged in parallel with the gate line; and
    forming a third passivation layer on the second passivation layer on which the plurality of first electrodes are formed, forming a second transparent conductive layer as a fifth conductive layer on the third passivation layer, and forming a plurality of second electrodes by etching the second transparent conductive layer using a seventh mask process, the plurality of second electrodes being arranged in parallel with the gate lines and the data lines.

11. The method of claim 10, wherein the method further comprises:
    forming a sixth conductive layer on the second passivation layer on which the plurality of the first electrodes are formed, and forming a plurality of first connecting wires connecting the plurality of the first electrodes to each other by etching the sixth conductive layer.

12. The method of claim 11, wherein the method further comprises:
forming a seventh conductive layer on the third passivation layer on which the plurality of the second electrodes are formed, and forming a plurality of first connecting wires connecting the plurality of the second electrodes to each other in parallel with the data line by etching the seventh conductive layer.

13. The method of claim 12, wherein the plurality of second electrodes serve as common electrodes and touch sensing electrodes.

14. The method of claim 12, wherein the first plurality of electrodes and the first and second connecting wires are made of a metal material selected from the group consisting of Cu, CuOx, Al, AlNd, Mo, MoTi, and Cr, and wherein the second plurality of electrodes are made of a transparent conductive material selected from the group consisting of indium tin oxide (ITO), indium zinc oxide (IZO), and gallium-doped zinc oxide (GZO).

* * * * *